(12) United States Patent
Okada et al.

(10) Patent No.: US 11,551,933 B2
(45) Date of Patent: Jan. 10, 2023

(54) SUBSTRATE PROCESSING METHOD AND SUBSTRATE PROCESSING APPARATUS

(71) Applicant: TOKYO ELECTRON LIMITED, Tokyo (JP)

(72) Inventors: Mitsuhiro Okada, Nirasaki (JP); Yasushi Fujii, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 374 days.

(21) Appl. No.: 16/781,362

(22) Filed: Feb. 4, 2020

(65) Prior Publication Data

US 2020/0258748 A1 Aug. 13, 2020

(30) Foreign Application Priority Data

Feb. 13, 2019 (JP) .............................. JP2019-023883

(51) Int. Cl.
*H01L 21/44* (2006.01)
*H01L 21/285* (2006.01)
*C23C 16/46* (2006.01)

(52) U.S. Cl.
CPC ........ *H01L 21/28562* (2013.01); *C23C 16/46* (2013.01)

(58) Field of Classification Search
CPC .............. H01L 21/28562; C25D 16/34; C25D 16/45527; C25D 16/45553; C25D 18/1283; C25D 7/123
USPC ....................................................... 438/677
See application file for complete search history.

(56) References Cited

U.S. PATENT DOCUMENTS

| | | | |
|---|---|---|---|
| 6,933,021 B2 | 8/2005 | Chou et al. | |
| 2002/0168468 A1 | 11/2002 | Chou et al. | |
| 2003/0140988 A1* | 7/2003 | Gandikota | ........ H01L 21/76877 257/E21.174 |
| 2013/0244410 A1 | 9/2013 | Arena et al. | |
| 2016/0130719 A1* | 5/2016 | Richardson | ......... C23C 18/1216 205/333 |
| 2016/0284552 A1 | 9/2016 | Ogawa | |

FOREIGN PATENT DOCUMENTS

| | | |
|---|---|---|
| CN | 1777694 A | 5/2006 |
| JP | 2000-228372 A | 8/2000 |
| JP | 2004-6699 A | 1/2004 |
| KR | 10-2004-0066882 A | 7/2004 |
| KR | 10-2016-0001609 A | 1/2016 |
| TW | 201641734 A | 12/2016 |

* cited by examiner

*Primary Examiner* — Brook Kebede
(74) *Attorney, Agent, or Firm* — Nath, Goldberg & Meyer; Jerald L. Meyer; Tanya E. Harkins

(57) ABSTRACT

According to one embodiment of the present disclosure, there is provided a substrate processing method including: providing a substrate; forming a seed layer on a surface of the substrate by heating a stage on which the substrate is placed to a first temperature and supplying a first source gas to the substrate; and forming a metal-containing film by heating the stage on which the substrate is placed to a second temperature and supplying a second source gas and a first reducing gas to the substrate on which the seed layer is formed.

19 Claims, 9 Drawing Sheets

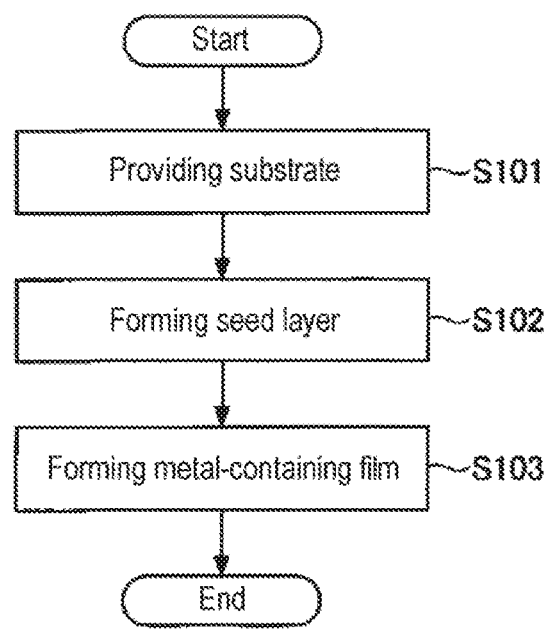

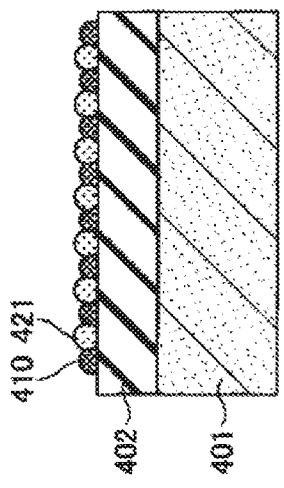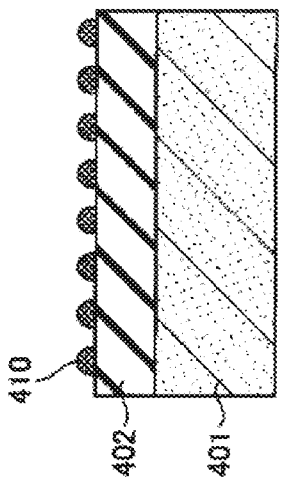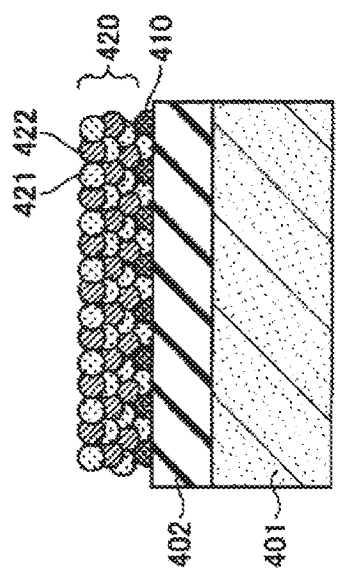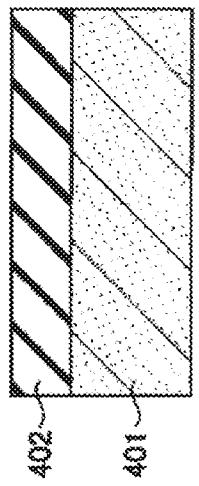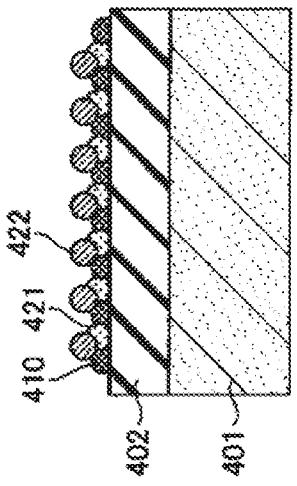

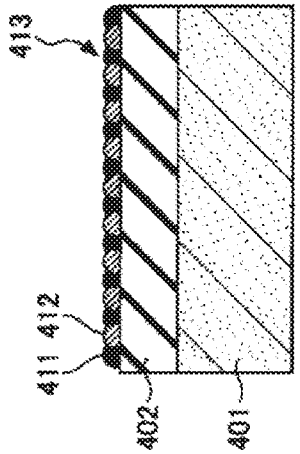
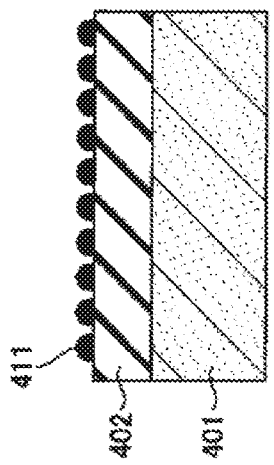
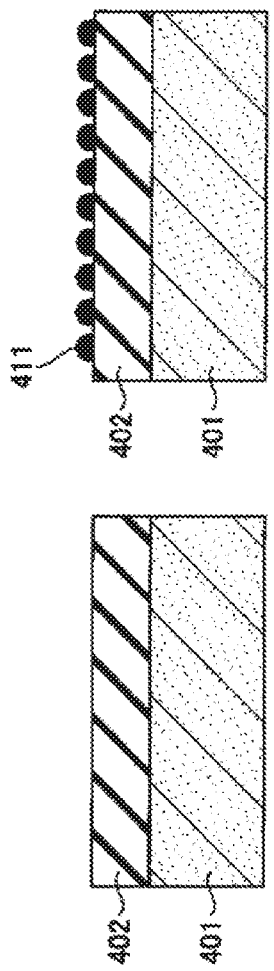
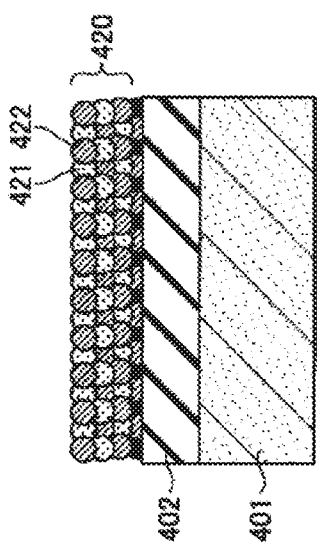
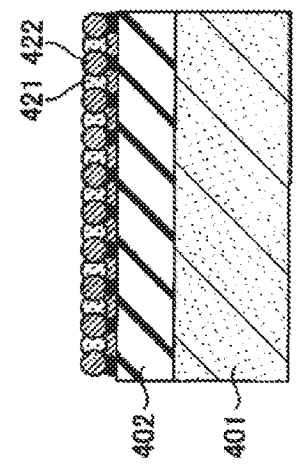
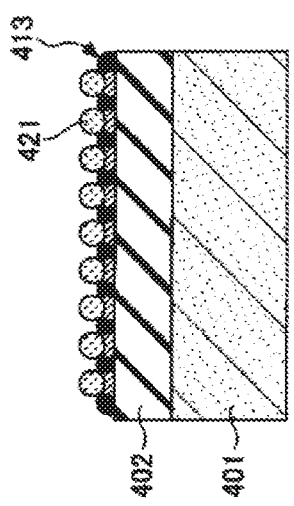
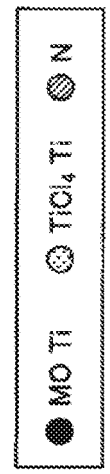

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-023883, filed on Feb. 13, 2019, the entire contents of which are incorporated herein by reference.

TECHNICAL FIELD

The present disclosure relates to a substrate processing method and a substrate processing apparatus.

BACKGROUND

For example, it is known to use a TiN film as a 3D NAND word line or barrier metal.

Patent Document 1 discloses a substrate processing apparatus for forming a TiN film or the like.

PRIOR ART DOCUMENT

Patent Document

Patent Document 1: Japanese Laid-open Patent Publication No. 2004-6699

SUMMARY

According to one embodiment of the present disclosure, there is provided a substrate processing method including: providing a substrate; forming a seed layer on a surface of the substrate by heating a stage on which the substrate is placed to a first temperature and supplying a first source gas to the substrate; and forming a metal-containing film by heating the stage on which the substrate is placed to a second temperature and supplying a second source gas and a first reducing gas to the substrate on which the seed layer is formed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a flowchart illustrating an exemplary operation in the cluster system according to the present embodiment.

FIGS. 5A to 5E are schematic cross-sectional views illustrating respective states of a substrate in respective steps of the first embodiment.

FIGS. 7A to 7F are schematic cross-sectional views illustrating respective states of a substrate in respective steps of the second embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Cluster System

Figure 1:
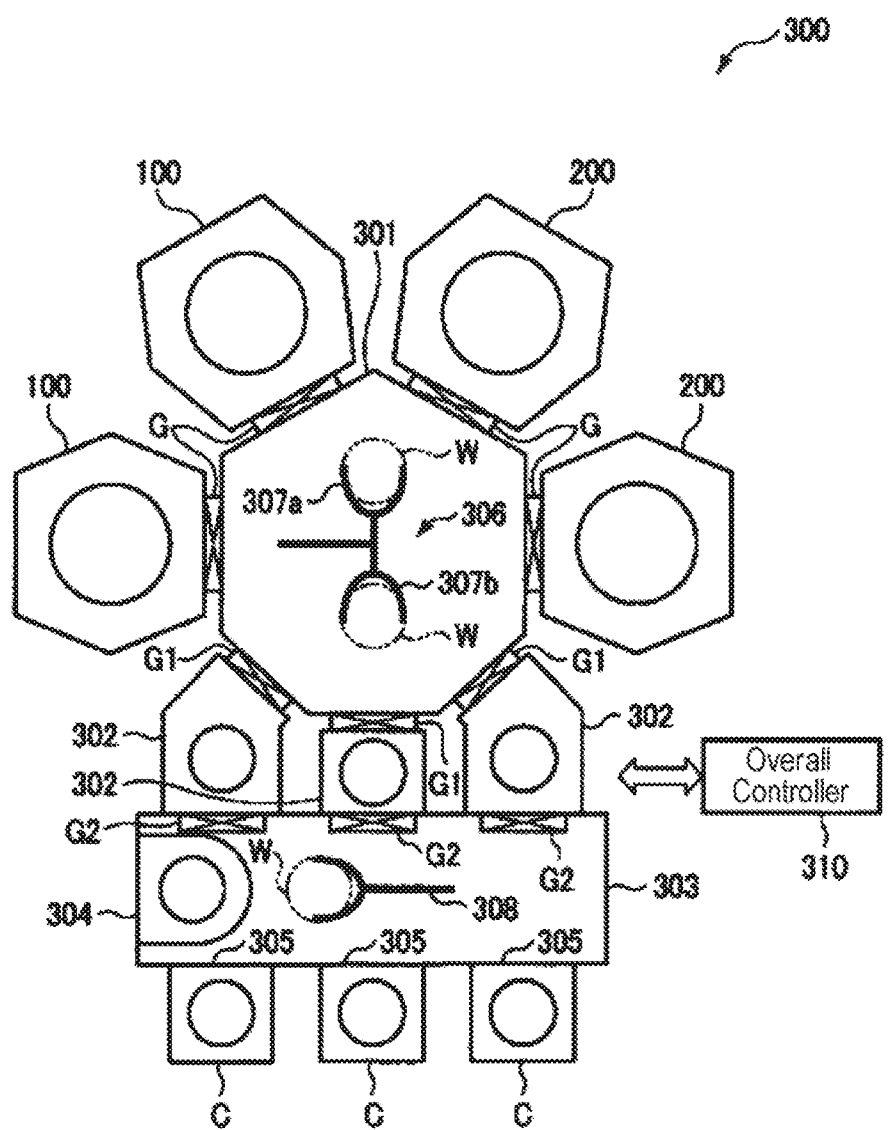
FIG. 1 is a view illustrating the configuration of a cluster system according to an embodiment.

A cluster system (substrate processing system) 300 according to an embodiment will be described with reference to FIG. 1. FIG. 1 is a view illustrating the configuration of the cluster system 300 according to the present embodiment. The cluster system 300 is an apparatus that forms a seed layer on a surface of a substrate W, such as a wafer, and then forms a metal-containing film on the substrate W on which the seed layer is formed.

As illustrated in FIG. 1, the cluster system 300 includes two seed layer forming apparatuses 100 and two film forming apparatuses 200. These apparatuses are connected to four walls of a vacuum transport chamber 301 having a heptagonal shape in a plan view via gate valves G, respectively. A gas of the interior of the vacuum transport chamber 301 is exhausted by a vacuum pump and is maintained at a predetermined degree of vacuum.

Each film forming apparatus 200 supplies $TiCl_4$ gas as a source gas and $NH_3$ gas as a reducing gas to a substrate W so as to form a TiN film as the metal-containing film on a surface of the substrate W. Each film forming apparatus 200 may be formed of a chemical vapor deposition (CVD) apparatus or an atomic layer deposition (ALD) apparatus.

Each seed layer forming apparatus 100 is an apparatus that forms the seed layer for promoting the adsorption of $TiCl_4$ on the surface of a substrate W before forming a TiN film in the film forming apparatus 200.

Three load-lock chambers 302 are connected to the other three walls of the vacuum transport chamber 301 via gate valves G1. An atmospheric transport chamber 303 is provided on the side opposite the vacuum transport chamber 301 with the load-lock chambers 302 interposed between the atmospheric transport chamber 303 and the vacuum transport chamber 301. The three load-lock chambers 302 are connected to the atmospheric transport chamber 303 via gate valves G2, respectively. The load-lock chambers 302 perform pressure control between atmospheric pressure and vacuum when a substrate W is transported between the atmospheric transport chamber 303 and the vacuum transport chamber 301.

A wall of the atmospheric transport chamber 303, opposite a wall on which the load-lock chambers 302 are mounted, includes three carrier-mounting ports 305 in each of which a carrier (e.g., a FOUP) C is located for accommodating a substrate W. In addition, on a side wall of the atmospheric transport chamber 303, an alignment chamber 304 is provided to perform alignment of a substrate W. The atmospheric transport chamber 303 is configured to form a downflow of clean air therein.

In the vacuum transport chamber 301, a transport device 306 is provided. The transport device 306 transports substrates W to the seed layer forming apparatuses 100, the film forming apparatuses 200, and the load-lock chambers 302. The transport device 306 may have two independently movable transport arms 307a and 307b.

Within the atmospheric transport chamber 303, a transport device 308 is provided. The transport device 308 is configured to transport substrates W to the carriers C, the load-lock chambers 302, and the alignment chamber 304.

The cluster system 300 has an overall controller 310. The overall controller 310 includes: a main controller including a CPU (e.g., computer) configured to control, for example, each component of the seed layer forming apparatuses 100 and the film forming apparatuses 200, an exhauster or the transport device 306 of the vacuum transport chamber 301, an exhauster or a gas supply of each load-lock chambers 302, the transport device 308 of the atmospheric transport chamber 303, and a drive system of the gate valves G, G1, and G2; an input device (e.g., a keyboard or a mouse); an output device (e.g., a printer); a display device (e.g., a display); and a storage device (e.g., a storage medium). The main controller of the overall controller 310 causes the cluster system 300 to execute a predetermined operation on the basis of, for example, a processing recipe stored in, for example, a storage medium embedded in the storage device or a storage medium set in the storage device. In addition, the overall controller 310 may be a higher-order controller of a controller of each unit, such as a control device 6 (see, e.g., FIG. 2) to be described later.

Next, the operation of the cluster system 300 configured as described above will be described. The following processing operations are executed on the basis of the processing recipes stored in a storage medium in the overall controller 310.

First, the overall controller 310 causes the transport device 308 to take out a substrate W from the carrier C connected to the atmospheric transport chamber 303, and to transport the substrate W to the atmospheric transport chamber 303. Then, the overall controller 310 opens the gate valve G2 of any load-lock chamber 302, and causes the substrate W held by the transport device 308 to be loaded into the load-lock chamber 302. After the transport arm of the transport device 308 is retracted to the atmospheric transport chamber 303, the overall controller 310 closes the gate valve G2, and vacuums and exhausts gas of the interior of the load-lock chamber 302. In addition, after taking out the substrate W from the carrier C and before loading the substrate W into the load-lock chamber 302, alignment of the substrate W is performed in the alignment chamber 304.

When the load-lock chamber 302 reaches a predetermined degree of vacuum, the overall controller 310 opens the gate valve G1 of the load-lock chamber 302, and causes the transport device 306 to take out the substrate W from the load-lock chamber 302 and to transport the substrate W to the vacuum transport chamber 301. After the transport arm of the transport device 306 is retracted to the vacuum transport chamber 301, the overall controller 310 closes the gate valve G1.

The overall controller 310 opens the gate valve G of the seed layer forming apparatus 100, and causes the substrate W held by the transport device 306 to be loaded into the seed layer forming apparatus 100. After the transport arm of the transport device 306 is retracted to the vacuum transport chamber 301, the overall controller 310 closes the gate valve G and causes the seed layer forming apparatus 100 to perform a process of forming the seed layer on the surface of the substrate W.

After the seed layer forming process is terminated, the overall controller 310 opens the gate valve G of the seed layer forming apparatus 100, and causes the transport device 306 to take out the substrate W from the seed layer forming apparatus 100 and to transport the substrate W to the vacuum transport chamber 301. After the transport arm of the transport device 306 is retracted to the vacuum transport chamber 301, the overall controller 310 closes the gate valve G of the seed layer forming apparatus 100.

The overall controller 310 opens the gate valve G of the film forming apparatus 200, and causes the substrate W held by the transport device 306 to be loaded into the film forming apparatus 200. After the transport arm of the transport device 306 is retracted to the vacuum transport chamber 301, the overall controller 310 closes the gate valve G and causes the film forming apparatus 200 to perform a process of forming the metal-containing film.

After the process of forming the metal-containing film is terminated, the overall controller 310 opens the gate valve G of the film forming apparatus 200, and causes the transport device 306 to take out the substrate W from the film forming apparatus 200 and to transport the substrate W to the vacuum transport chamber 301. After the transport arm of the transport device 306 is retracted to the vacuum transport chamber 301, the overall controller 310 closes the gate valve G of the film forming apparatus 200.

The overall controller 310 opens the gate valve G1 of any load-lock chamber 302, and causes the substrate W held by the transport arm 306 to be loaded into the load-lock chamber 302. After the transport arm of the transport device 306 is retracted to the vacuum transport chamber 301, the overall controller 310 closes the gate valve G1 and returns the interior of the load-lock chamber 302 to an air atmosphere.

At the time when a load-lock chamber 302 becomes a predetermined air atmosphere, the overall controller 310 opens the gate valve G2 of the load-lock chamber 302, and causes the transport device 308 to take out the substrate W from the load-lock chamber 302 and to transport the substrate W to the atmospheric transport chamber 303. After the transport arm of the transport device 308 is retracted to the atmospheric transport chamber 303, the overall controller 310 closes the gate valve G2 of the load-lock chamber 302. In addition, the overall controller 310 returns the substrate W held by the transport device 308 to the carrier C.

As described above, according to the cluster system 300 according to the present embodiment, after the seed layer is formed on the surface of a substrate W by the seed layer forming apparatus 100, the substrate W may be transported from the seed layer forming apparatus 100 to the film forming apparatus 200 while maintaining the vacuum atmosphere (without breaking the vacuum), and the metal-containing film may be formed on the surface of the substrate W in the film forming apparatus 200.

Seed Layer Forming Apparatus

An exemplary configuration of the seed layer forming apparatus 100 will be described with reference to FIG. 2.

Figure 2:
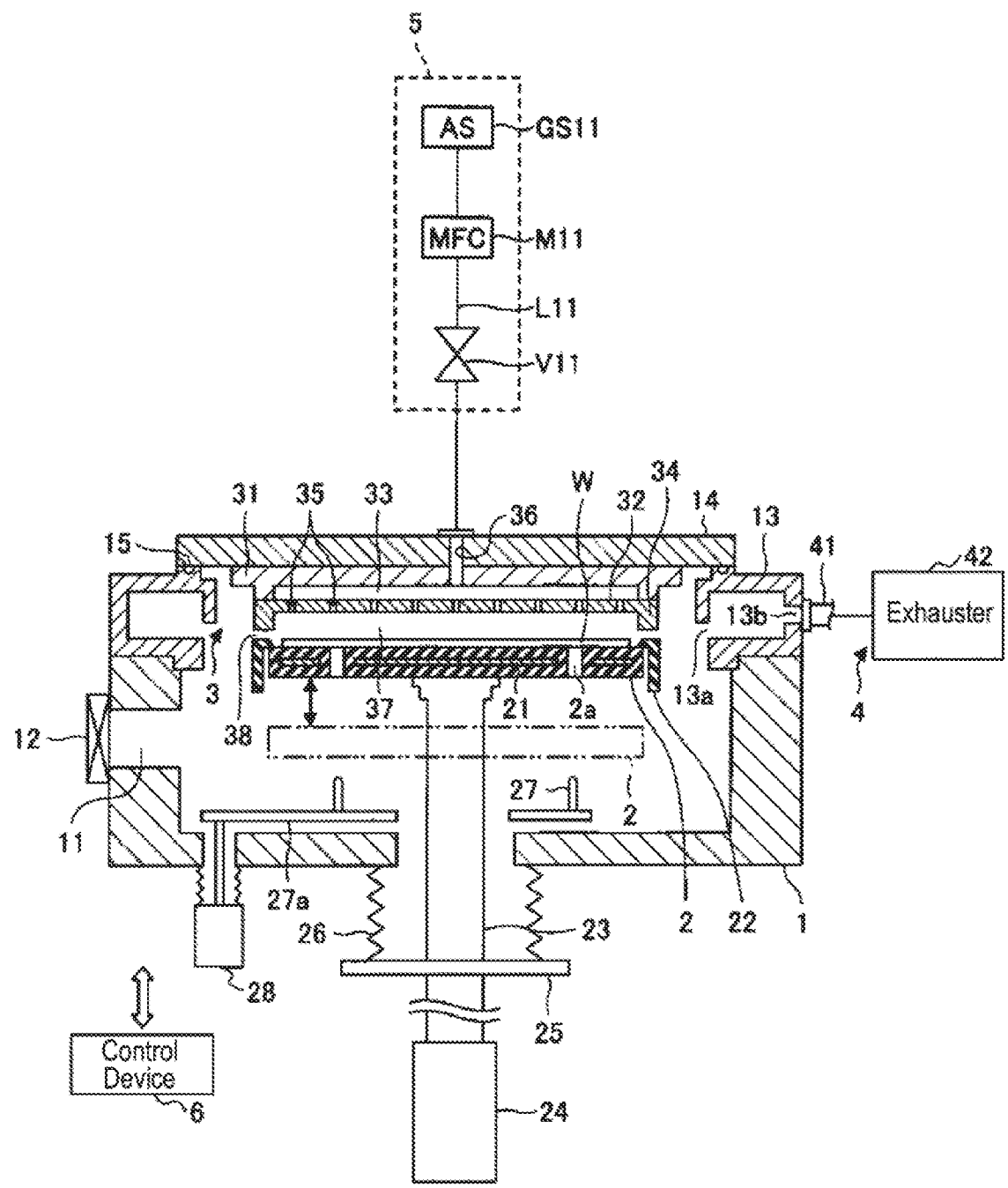
FIG. 2 is an example of a schematic cross-sectional view of a seed layer forming apparatus provided in the cluster system according to a first embodiment.

FIG. 2 is an example of a schematic cross-sectional view of the seed layer forming apparatus 100 provided in the cluster system 300 according to the first embodiment.

As illustrated in FIG. 2, the seed layer forming apparatus 100 includes a processing chamber 1, a stage 2, a shower head 3, an exhaust part 4, a processing gas supply 5, and a control device 6.

The processing chamber 1 is made of a metal such as aluminum and has a substantially cylindrical shape. A loading/unloading port 11 is formed in a side wall of the processing chamber 1 to load or unload a substrate W therethrough, and the loading/unloading port 11 is configured to be opened and closed by a gate valve 12. An annular exhaust duct 13 having a rectangular cross section is provided on a main body of the processing chamber 1. A slit 13a is formed in the exhaust duct 13 along an inner peripheral surface thereof. In addition, an exhaust port 13b is formed in an outer wall of the exhaust duct 13. On an upper surface of the exhaust duct 13, a ceiling wall 14 is provided so as to close an upper opening of the processing chamber 1. The space between the ceiling wall 14 and the exhaust duct 13 is hermetically sealed with a seal ring 15.

The stage 2 horizontally supports a substrate W in the processing chamber 1. The stage 2 is formed in a disk shape having a size corresponding to the substrate W, and is supported by a support member 23. The stage 2 is made of a ceramic material such as aluminum nitride (AlN) or a metal material such as aluminum or a nickel-based alloy, and a heater 21 is embedded in the stage 2 in order to heat the substrate W. The heater 21 is fed with power from a heater power supply (not illustrated) and generates heat. Then, by controlling an output of the heater 21 by a temperature signal of a thermocouple (not illustrated) provided in the vicinity of a substrate placement surface of an upper surface of the stage 2, the substrate W is controlled to have a predetermined temperature.

The stage 2 is provided with a cover member 22 made of ceramic such as alumina so as to cover an outer peripheral area of the wafer placement surface and the side surface of the stage 2.

The support member 23 extends to a lower side of the processing chamber 1 through a hole formed in a bottom wall of the processing chamber 1 from a center of a bottom surface of the stage 2, and a lower end of the support member 23 is connected to a lift 24. The stage 2 is configured to ascend/descend, via the support member 23 and the lift 24, between a processing position illustrated in FIG. 2 and a transport position (indicated by the two-dot chain line below the processing position) where the wafer is capable of being transported. In addition, a flange part 25 is provided on the support member 23 below the processing chamber 1, and a bellows 26, which partitions an atmosphere within the processing chamber 1 from an outside air, is provided between the bottom surface of the processing chamber 1 and the flange part 25 to expand and contract in response to the ascending/descending movement of the stage 2.

Three wafer support pins 27 (of which only two are illustrated) are provided in the vicinity of the bottom surface of the processing chamber 1 so as to protrude upward from a lifting plate 27a. The wafer support pins 27 are configured to be capable of ascending/descending via the lifting plate 27a by a lift 28 provided below the processing chamber 1, and are inserted into through holes 2a provided in the stage 2 located at the transport position so as to be capable of protruding/receding with respect to the upper surface of the stage 2. By causing the wafer support pins 27 to ascend or descend in this way, a substrate W is delivered between a wafer transport device (not illustrated) and the stage 2.

The shower head 3 supplies a processing gas into the processing chamber 1 in a form of a shower. The shower head 3 is made of a metal and is provided to face the stage 2. The shower head 3 has a diameter, which is substantially equal to that of the stage 2. The shower head 3 has a main body 31 fixed to the ceiling wall 14 of the processing chamber 1 and a shower plate 32 connected to a lower side of the main body 31. A gas diffusion space 33 is formed between the main body 31 and the shower plate 32. In the gas diffusion space 33, a gas inlet hole 36 is provided through a center of the main body 31 and the ceiling wall 14 of the processing chamber 1. An annular protrusion 34 protruding downward is formed at a peripheral edge portion of the shower plate 32, and gas ejection holes 35 are formed in a flat surface inside the annular protrusion 34 of the shower plate 32.

In the state in which the stage 2 is located at the processing position, a processing space 37 is formed between the shower plate 32 and the stage 2, and the annular protrusion 34 and an upper surface of the cover member 22 of the stage 2 are close to each other so as to form an annular gap 38 therebetween.

The exhaust part 4 exhausts a gas of an interior of the processing chamber 1. The exhaust part 4 includes an exhaust pipe 41 connected to the exhaust port 13b of the exhaust duct 13, and an exhauster 42 connected to the exhaust pipe 41 and having, for example, a vacuum pump and a pressure control valve. During the process, the gas within the processing chamber 1 reaches the exhaust duct 13 via the slit 13a, and is exhausted from the exhaust duct 13 through the exhaust pipe 41 by the exhauster 42 of the exhaust part 4.

The processing gas supply 5 has a source gas supply line L11. The source gas supply line L11 extends from a source gas supply source GS11, which is a supply source of a silicon-containing gas (e.g., aminosilane gas), and is connected to a gas inlet hole 36. The source gas supply line L11 is provided with a mass flow controller M11, and an opening/closing valve V11 in this order from the source gas supply source GS11 side. The mass flow controller M11 controls a flow rate of the aminosilane gas flowing through the source gas supply line L11. The opening/closing valve V11 switches the supply and stop of the aminosilane gas.

The control device 6 controls an operation of each part of the seed layer forming apparatus 100. The control device 6 includes a central processing unit (CPU), read only memory (ROM), and random access memory (RAM). The CPU executes a desired process according to a recipe stored in a storage area of, for example, the RAM. In the recipe, apparatus control information for a process condition is set. The control information may be, for example, a gas flow rate, a pressure, a temperature, and a process time. The recipe and a program used by the control device 6 may be stored in, for example, a hard disk or non-transitory semiconductor memory. In addition, for example, the recipe may be set in a predetermined position to be read out in a state of being stored in a storage medium readable by a portable computer, such as a CD-ROM or DVD.

Film Forming Apparatus

Figure 3:
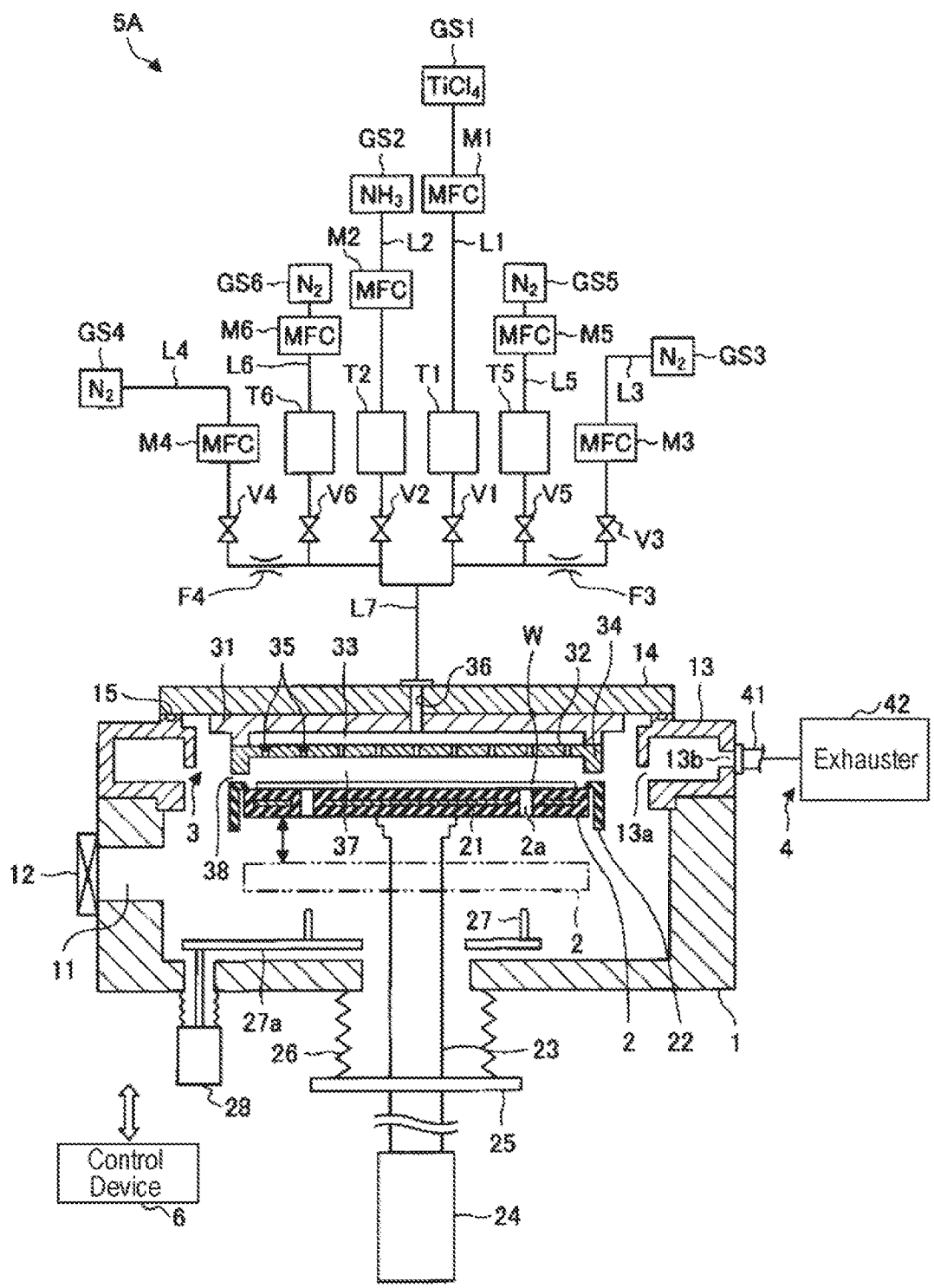
FIG. 3 is an example of a schematic cross-sectional view of a film forming apparatus provided in the cluster system according to the present embodiment.

Next, an exemplary configuration of the film forming apparatus 200 will be described with reference to FIG. 3. FIG. 3 is an example of a schematic cross-sectional view of the film forming apparatus 200 provided in the cluster system 300 according to the present embodiment.

As illustrated in FIG. 3, the film forming apparatus 200 includes a processing chamber 1, a stage 2, a shower head 3, an exhaust part 4, a processing gas supply 5A, and a control device 6. Regarding a configuration overlapping that of the seed layer forming apparatus 100, a redundant description will be omitted.

The processing gas supply 5A includes a source gas supply line L1, a reducing gas supply line L2, a first continuous $N_2$ gas supply line L3, a second continuous $N_2$ gas supply line L4, a first flash purge line L5, and a second flash purge line L6.

The source gas supply line L1 extends from a source gas supply source GS1, which is a supply source of a metal-containing gas (e.g., $TiCl_4$ gas), and is connected to a merging pipe L7. The merging pipe L7 is connected to the gas inlet hole 36. The source gas supply line L1 is provided with a mass flow controller M1, a buffer tank T1, and an opening/closing valve V1 in this order from the source gas supply source GS1 side. The mass flow controller M1 controls a flow rate of the $TiCl_4$ gas flowing through the source gas supply line L1. The buffer tank T1 temporarily stores the $TiCl_4$ gas, and supplies the necessary $TiCl_4$ gas in a short time. The opening/closing valve V1 switches the supply and stop of $TiCl_4$ gas during an atomic layer deposition (ALD) process.

The reducing gas supply line L2 extends from a reducing gas supply source GS2, which is a supply source of a reducing gas (a nitrogen-containing gas) (e.g., $NH_3$ gas), and is connected to the merging pipe L7. The reducing gas supply line L2 is provided with a mass flow controller M2, a buffer tank T2, and an opening/closing valve V2 in this order from the reducing gas supply source GS2 side. The mass flow controller M2 controls a flow rate of $NH_3$ gas flowing through the reducing gas supply line L2. The buffer tank T2 temporarily stores the $NH_3$ gas, and supplies the necessary $NH_3$ gas in a short time. The opening/closing valve V2 switches the supply and stop of the $NH_3$ gas during the ALD process.

The first continuous $N_2$ gas supply line L3 extends from an $N_2$ gas supply source GS3, which is a supply source of $N_2$ gas, and is connected to the source gas supply line L1. Thus, the $N_2$ gas is supplied to the source gas supply line L1 side through the first continuous $N_2$ gas supply line L3. The first continuous $N_2$ gas supply line L3 constantly supplies the $N_2$ gas during film formation through the ALD method, and the $N_2$ gas functions as a carrier gas of $TiCl_4$ gas and also functions as a purge gas. The first continuous $N_2$ gas supply line L3 is provided with a mass flow controller M3, an opening/closing valve V3, and an orifice F3 in this order from the $N_2$ gas supply source GS3 side. The mass flow controller M3 controls a flow rate of the $N_2$ gas flowing through the first continuous $N_2$ gas supply line L3. The orifice F3 suppresses a backflow of a relatively high flow rate of a gas supplied by the buffer tanks T1 and T5 into the first continuous $N_2$ gas supply line L3.

The second continuous $N_2$ gas supply line L4 extends from an $N_2$ gas supply source GS4, which is a supply source of $N_2$ gas, and is connected to the reducing gas supply line L2. Thus, the $N_2$ gas is supplied to the reducing gas supply line L2 side through the second continuous $N_2$ gas supply line L4. The second continuous $N_2$ gas supply line L4 constantly supplies $N_2$ gas during film formation through the ALD method, and the $N_2$ gas functions as a carrier gas of $NH_3$ gas and also functions as a purge gas. The second continuous $N_2$ gas supply line L4 is provided with a mass flow controller M4, an opening/closing valve V4, and an orifice F4 in this order from the $N_2$ gas supply source GS4 side. The mass flow controller M4 controls a flow rate of the $N_2$ gas flowing through the second continuous $N_2$ gas supply line L4. The orifice F4 suppresses a backflow of a relatively high flow rate of a gas supplied by the buffer tanks T2 and T6 into the second continuous $N_2$ gas supply line L4.

The first flash purge line L5 extends from an $N_2$ gas supply source GS5, which is a supply source of $N_2$ gas, and is connected to the first continuous $N_2$ gas supply line L3. Thus, the $N_2$ gas is supplied to the source gas supply line L1 side through the first flash purge line L5 and the first continuous $N_2$ gas supply line L3. The first flash purge line L5 supplies $N_2$ gas only in a purge step during film formation through the ALD method. The first flash purge line L5 is provided with a mass flow controller M5, a buffer tank T5, and an opening/closing valve V5 in this order from the $N_2$ gas supply source GS5 side. The mass flow controller M5 controls a flow rate of the $N_2$ gas flowing through the first flash purge line L5. The buffer tank T5 temporarily stores the $N_2$ gas, and supplies the necessary $N_2$ gas in a short time. The opening/closing valve V5 switches the supply and stop of the $N_2$ gas during the purge in the ALD process.

The second flash purge line L6 extends from an $N_2$ gas supply source GS6, which is a supply source of $N_2$ gas, and is connected to the second continuous $N_2$ gas supply line L4. Thus, the $N_2$ gas is supplied to the reducing gas supply line L2 side through the second flash purge line L6 and the second continuous $N_2$ gas supply line L4. The second flash purge line L6 supplies $N_2$ gas only when it is a purge step during film formation through the ALD method. The second flash purge line L6 is provided with a mass flow controller M6, a buffer tank T6, and an opening/closing valve V6 in this order from the $N_2$ gas supply source GS6 side. The mass flow controller M6 controls a flow rate of the $N_2$ gas flowing through the second flash purge line L6. The buffer tank T6 temporarily stores the $N_2$ gas, and supplies the necessary $N_2$ gas in a short time. The opening/closing valve V6 switches the supply and stop of the $N_2$ gas during the purge in the ALD process.

Film Forming Method of First Embodiment

Next, a film forming method using the cluster system 300 according to the first embodiment will be described with reference to FIGS. 4 to 5E. FIG. 4 is a flowchart illustrating an exemplary film forming method in the cluster system 300 according to the present embodiment. FIGS. 5A to 5E are schematic cross-sectional views illustrating respective states of a substrate W in respective steps of the film forming method the first embodiment.

In step S101, a substrate W is provided. As illustrated in FIG. 5A, the substrate W has an insulating film 402 formed on a silicon substrate 401. In addition, the insulating film 402 is mainly composed of a $SiO_2$ film, but part of the insulating film 402 may be a SiN film. The substrate W is accommodated in the carrier C, for example, in an air atmosphere. The substrate W is transported from the carrier C to the seed layer forming apparatus 100 through the atmospheric transport chamber 303, a load-lock chamber 302, and the vacuum transport chamber 301 by the transport devices 306 and 308.

In step S102, the overall controller 310 executes a process for forming the seed layer. First, the substrate W is loaded into the processing chamber 1 of the seed layer forming apparatus 100 illustrated in FIG. 2. Specifically, the gate valve 12 is opened in a state in which the stage 2 is lowered to the transport position. Subsequently, the substrate W is loaded into the processing chamber 1 through the loading/unloading port 11 by a transport arm (not illustrated), and is placed on the stage 2 heated to a predetermined temperature (e.g., 100 degrees C. to 550 degrees C.) by the heater 21. Subsequently, the stage 2 is raised to the processing position, and the interior of the processing chamber 1 is decompressed to a predetermined degree of vacuum. Then, the processing gas supply 5 supplies $N_2$ gas into the processing chamber 1 to increase a pressure in the processing chamber 1 and to stabilize a temperature of the substrate W on the stage 2.

Subsequently, the processing gas supply 5 of the seed layer forming apparatus 100 supplies a silicon-containing gas (e.g., aminosilane gas) as a source gas. As the silicon-containing gas, an inorganic material such as hexachlorodisilane (HCD) may be used. The source gas may be supplied continuously for a specific time, or may be supplied intermittently. When the source gas is supplied intermittently, the supply may be performed, for example, between 1 and 100 cycles. As a result, as illustrated in FIG. 5B, aminosilane is thermally decomposed on the surface of the substrate W heated to the predetermined temperature, and a silicon seed layer 410 is formed. As illustrated in FIG. 5B, the seed layer 410 may be a discontinuous film.

Here, an example of process conditions of the process for forming the seed layer in the seed layer forming apparatus 100 is represented below.

Source gas: diisopropylamino silane (DIPAS)
Substrate temperature: 100 to 550 degrees C.
Source gas flow rate: 50 to 500 sccm
Processing space pressure: 1 to 10 Torr After the seed layer forming process, the substrate W is transported from the seed layer forming apparatus 100 to the film forming apparatus 200 through the vacuum transport chamber 301 by the transport device 308.

In step S103, the overall controller 310 executes a process for forming the metal-containing film.

Here, the film forming process of the metal-containing film in the film forming apparatus 200 will be described by taking a case in which a TiN film is formed on a substrate W through the ALD process, as an example.

First, the substrate W is loaded into the processing chamber 1 of the film forming apparatus 200 illustrated in FIG. 3. Specifically, the gate valve 12 is opened in the state in which the stage 2 is lowered to the transport position. Subsequently, the substrate W is loaded into the processing chamber 1 through the loading/unloading port 11 by a transport arm (not illustrated), and is placed on the stage 2 heated to a predetermined temperature (e.g., 300 degrees C. to 700 degrees C.) by the heater 21. Subsequently, the stage 2 is raised to the processing position, and the interior of the processing chamber 1 is decompressed to a predetermined degree of vacuum. Then, the opening/closing valves V3 and V4 are opened, and the opening/closing valves V1, V2, V5, and V6 are closed. As a result, $N_2$ gas is supplied from the $N_2$ gas supply sources GS3 and GS4 into the processing chamber 1 through the first continuous $N_2$ gas supply line L3 and the second continuous $N_2$ gas supply line L4 to raise a pressure in the processing chamber 1 and to stabilize the temperature of the wafer W on the stage 2. At this time, $TiCl_4$ gas is supplied from the source gas supply source GS1 into the buffer tank T1, and thus a pressure in the buffer tank T1 is maintained substantially constant. In addition, $N_2$ gas is supplied from the $N_2$ gas supply sources GS5 and GS6 into the buffer tanks T5 and T6, and thus pressures in the buffer tanks T5 and T6 are maintained substantially constant.

Subsequently, a TiN film is formed through the ALD process using $TiCl_4$ gas and $NH_3$ gas.

The ALD process is a process for forming a TiN film having a desired thickness on a substrate W by repeating the steps of supplying $TiCl_4$ gas, supplying first $N_2$ gas, supplying $NH_3$ gas (step S3), and supplying second $N_2$ gas in a predetermined number of cycles.

The step of supplying the $TiCl_4$ gas is the step of supplying $TiCl_4$ gas to the processing space 37. In the step of supplying $TiCl_4$ gas, first, in the state in which the opening/closing valves V3 and V4 open, $N_2$ gas (continuous $N_2$ gas) is continuously supplied from the $N_2$ gas supply sources GS3 and GS4 through the first continuous $N_2$ gas supply line L3 and the second continuous $N_2$ gas supply line L4. In addition, by opening the opening/closing valve V1, $TiCl_4$ gas is supplied from the source gas supply source GS1 through the source gas supply line L1 to the processing space 37 within the processing chamber 1. At this time, the $TiCl_4$ gas is temporarily stored in the buffer tank T1 and then supplied into the processing chamber 1.

Here, Ti originated from $TiCl_4$ is denoted by reference numeral 421. The seed layer 410 has a higher $TiCl_4$ gas adsorptivity than the surface of the substrate W on which the seed layer 410 is not formed (the surface of the insulating film 402). For this reason, as illustrated in FIG. 5C, $TiCl_4$ is appropriately adsorbed on the seed layer 410.

The step of supplying the first $N_2$ gas is the step of purging, for example, surplus $TiCl_4$ gas, in the processing space 37. In the step of supplying the first $N_2$ gas, in the state in which the supply of $N_2$ gas (continuous $N_2$ gas) through the first continuous $N_2$ gas supply line L3 and the second continuous $N_2$ gas supply line L4 is continued, the opening/closing valve V1 is closed and the supply of $TiCl_4$ gas is stopped. In addition, the opening/closing valves V5 and V6 are opened. Thereby, $N_2$ gas is supplied from the $N_2$ gas supply sources GS5 and GS6 to the processing space 37 within the processing chamber 1 through the first flash purge line L5 and the second flash purge line L6. At this time, since the $N_2$ gas is temporarily stored in the buffer tanks T5 and T6 and is then supplied into the processing chamber 1, it is possible to supply a relatively high flow rate. As a result, for example, surplus $TiCl_4$ gas in the processing space 37 is purged.

The step of supplying $NH_3$ gas is the step of supplying $NH_3$ gas to the processing space 37. In the step of supplying $NH_3$ gas, the opening/closing valve V2 is opened in the state in which the supply of $N_2$ gas (continuous $N_2$ gas) through the first continuous $N_2$ gas supply line L3 and the second continuous $N_2$ gas supply line L4 is continued. Thereby, $NH_3$ gas is supplied from the reducing gas supply source GS2 to the processing space 37 through the reducing gas supply line L2. At this time, the $NH_3$ gas is temporarily stored in the buffer tank T2 and then supplied into the processing chamber 1. The $TiCl_4$ adsorbed on the substrate W is reduced by the step of supplying $NH_3$ gas. At this time, the flow rate of $NH_3$ gas may be set to an amount at which a reducing reaction sufficiently occurs.

Here, N originated from $NH_3$ is denoted by reference numeral 422. As illustrated in FIG. 5D, Ti 421 adsorbed on the seed layer 410 is nitrified.

The step of supplying the second $N_2$ gas is the step of purging surplus $NH_3$ gas in the processing space 37. In the step of supplying the second $N_2$ gas, in the state in which the supply of $N_2$ gas (continuous $N_2$ gas) through the first continuous $N_2$ gas supply line L3 and the second continuous $N_2$ gas supply line L4 is continued, the opening/closing valve V2 is closed and the supply of $NH_3$ gas is stopped. In addition, the opening/closing valves V5 and V6 are opened. Thereby, $N_2$ gas is supplied from the $N_2$ gas supply sources GS5 and GS6 to the processing space 37 within the processing chamber 1 through the first flash purge line L5 and the second flash purge line L6. At this time, since the $N_2$ gas is temporarily stored in the buffer tanks T5 and T6 and is then supplied into the processing chamber 1, it is possible to supply a relatively high flow rate. As a result, for example, surplus $NH_3$ gas in the processing space 37 is purged.

Then, by repeating these steps in a predetermined number of cycles, a metal-containing film 420 having a desired film thickness is formed on the substrate W, as illustrated in FIG. 5E.

Here, an example of process conditions of the process for forming the metal-containing film in the film forming apparatus 200 is represented below.

Figure 6:
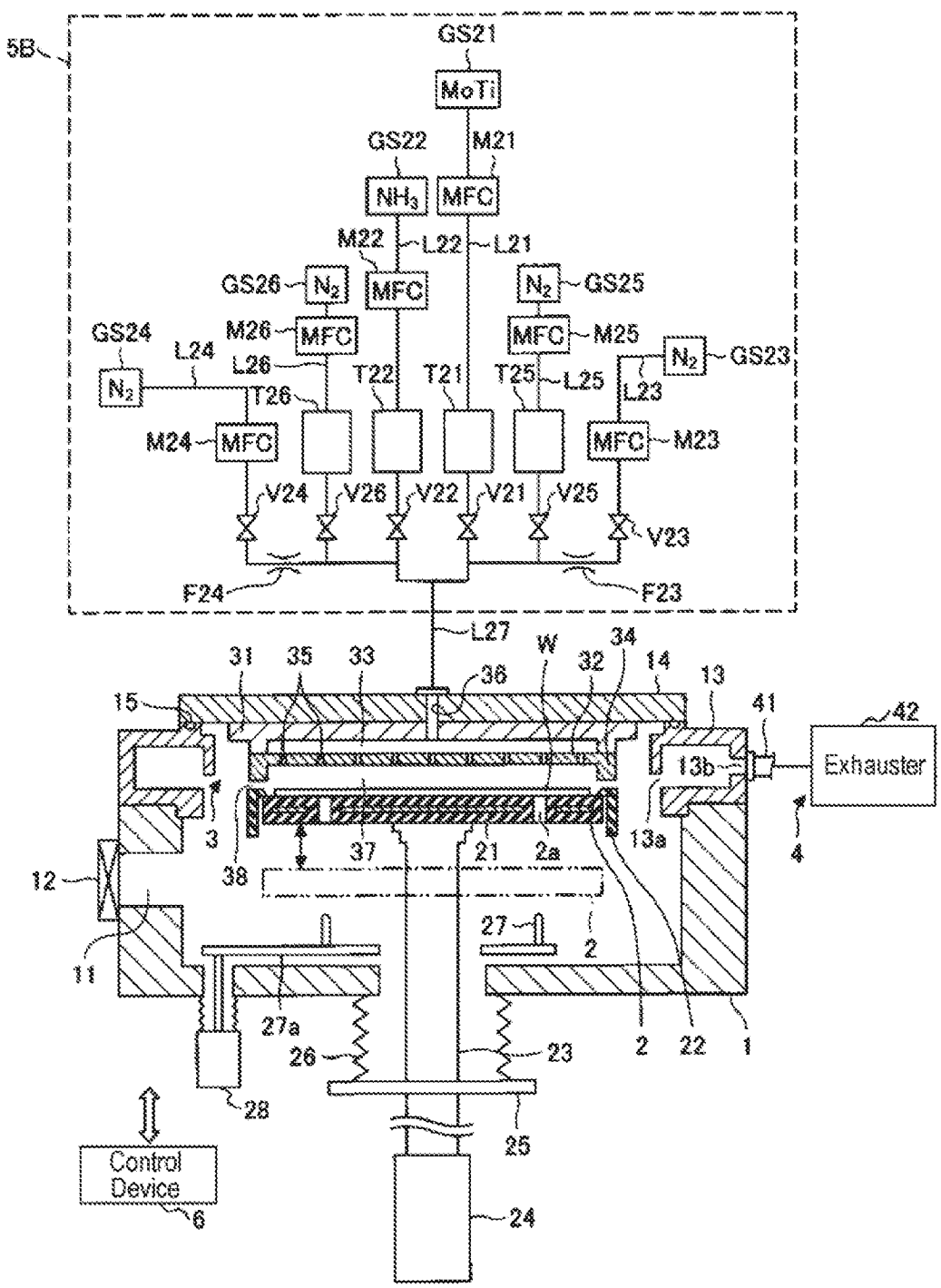
FIG. 6 is an example of a schematic cross-sectional view of a seed layer forming apparatus provided in the cluster system according to a second embodiment.

Source gas: $TiCl_4$
Reducing gas: $NH_3$
Substrate temperature: 300 to 700 degrees C.
Source gas flow rate: 100 to 1000 sccm
Reducing gas flow rate: 5 to 40 L/min
Processing space pressure: 0.5 to 10 Torr Next, a cluster system 300 according to the second embodiment will be described. FIG. 6 is an example of a schematic cross-sectional view of a seed layer forming apparatus 100A provided in the cluster system 300 according to the second embodiment. The cluster system 300 according to the second embodiment is provided with the seed layer forming apparatus 100A illustrated in FIG. 6 instead of the seed layer forming apparatus 100 illustrated in FIG. 2.

As illustrated in FIG. 6, the seed layer forming apparatus 100A includes a processing chamber 1, a stage 2, a shower head 3, an exhaust part 4, a processing gas supply 5B, and a control device 6. Regarding a configuration overlapping that of the seed layer forming apparatus 100, a redundant description will be omitted.

The processing gas supply 5B includes a source gas supply line L21, a reducing gas supply line L22, a first continuous $N_2$ gas supply line L23, a second continuous $N_2$ gas supply line L24, a first flash purge line L25, and a second flash purge line L26.

The source gas supply line L21 extends from a source gas supply source GS21, which is a source gas supply source, and is connected to a merging pipe L27. The merging pipe L27 is connected to the gas inlet hole 36. The source gas supply line L21 is provided with a mass flow controller M21, a buffer tank T21, and an opening/closing valve V21 in this order from the source gas supply source GS21 side. The mass flow controller M21 controls a flow rate of the source gas flowing through the source gas supply line L21. The buffer tank T21 temporarily stores the source gas, and supplies the necessary source gas in a short time. The opening/closing valve V21 switches the supply and stop of the $NH_3$ gas during the ALD process.

The reducing gas supply line L22 extends from a reducing gas supply source GS22, which is a supply source of a reducing gas (a nitrogen-containing gas) (e.g., $NH_3$ gas), and is connected to the merging pipe L27. The reducing gas supply line L22 is provided with a mass flow controller M22, a buffer tank T22, and an opening/closing valve V22 in this order from the reducing gas supply source GS22 side. The mass flow controller M22 controls a flow rate of the $NH_3$ gas flowing through the reducing gas supply line L22. The buffer tank T22 temporarily stores the $NH_3$ gas, and supplies the necessary $NH_3$ gas in a short time. The opening/closing valve V22 switches the supply and stop of the $NH_3$ gas during the ALD process.

The first continuous $N_2$ gas supply line L23 extends from an $N_2$ gas supply source GS23, which is a supply source of $N_2$ gas, and is connected to the source gas supply line L21. Thus, the $N_2$ gas is supplied to the source gas supply line L21 side through the first continuous $N_2$ gas supply line L23. The first continuous $N_2$ gas supply line L23 constantly supplies the $N_2$ gas during film formation through the ALD method, and the $N_2$ gas functions as a carrier gas of the source gas and also functions as a purge gas. The first continuous $N_2$ gas supply line L23 is provided with a mass flow controller M23, an opening/closing valve V23, and an orifice F23 in this order from the $N_2$ gas supply source GS23 side. The mass flow controller M23 controls a flow rate of the $N_2$ gas flowing through the first continuous $N_2$ gas supply line L23. The orifice F23 suppresses a backflow of a relatively high flow rate of a gas supplied by the buffer tanks T21 and T25 into the first continuous $N_2$ gas supply line L23.

The second continuous $N_2$ gas supply line L24 extends from an $N_2$ gas supply source GS24, which is a supply source of $N_2$ gas, and is connected to the reducing gas supply line L22. Thus, the $N_2$ gas is supplied to the reducing gas supply line L22 side through the second continuous $N_2$ gas supply line L24. The second continuous $N_2$ gas supply line L24 constantly supplies the $N_2$ gas during film formation through the ALD method, and the $N_2$ gas functions as a carrier gas of the reducing gas and also functions as a purge gas. The second continuous $N_2$ gas supply line L24 is provided with a mass flow controller M24, an opening/closing valve V24, and an orifice F24 in this order from the $N_2$ gas supply source GS24 side. The mass flow controller M24 controls a flow rate of the $N_2$ gas flowing through the second continuous $N_2$ gas supply line L24. The orifice F24 suppresses the backflow of a relatively high flow rate of a gas supplied by the buffer tanks T22 and T26 into the second continuous $N_2$ gas supply line L24.

The first flash purge line L25 extends from an $N_2$ gas supply source GS25, which is a supply source of $N_2$ gas, and is connected to the first continuous $N_2$ gas supply line L23. Thus, the $N_2$ gas is supplied to the source gas supply line L21 side through the first flash purge line L25 and the first continuous $N_2$ gas supply line L23. The first flash purge line L25 supplies $N_2$ gas only when it is a purge step during film formation through the ALD method. The first flash purge line L25 is provided with a mass flow controller M25, a buffer tank T25, and an opening/closing valve V25 in this order from the $N_2$ gas supply source GS25 side. The mass flow controller M25 controls a flow rate of the $N_2$ gas flowing through the first flash purge line L25. The buffer tank T25 temporarily stores the $N_2$ gas, and supplies the necessary $N_2$ gas in a short time. The opening/closing valve V25 switches the supply and stop of the $N_2$ gas during the purge in the ALD process.

The second flash purge line L26 extends from an $N_2$ gas supply source GS26, which is a supply source of $N_2$ gas, and is connected to the second continuous $N_2$ gas supply line L24. Thus, the $N_2$ gas is supplied to the reducing gas supply line L22 side through the second flash purge line L26 and the second continuous $N_2$ gas supply line L24. The second flash purge line L26 supplies $N_2$ gas only when it is a purge step during film formation through the ALD method. The second flash purge line L26 is provided with a mass flow controller M26, a buffer tank T26, and an opening/closing valve V26 in this order from the $N_2$ gas supply source GS26 side. The mass flow controller M26 controls a flow rate of the $N_2$ gas flowing through the second flash purge line L26. The buffer tank T26 temporarily stores the $N_2$ gas, and supplies the necessary $N_2$ gas in a short time. The opening/closing valve V26 switches the supply and stop of the $N_2$ gas during the purge in the ALD process.

Film Forming Method of Second Embodiment

Next, a film forming method using the cluster system 300 according to the second embodiment will be described with reference to FIGS. 4 and 7. FIGS. 7A to 7F are schematic cross-sectional views illustrating respective states of a substrate W in respective steps of the film forming method the second embodiment.

In step S101, a substrate W is provided. As illustrated in FIG. 7A, the substrate W has an insulating film 402 formed on a silicon substrate 401.

In step S102, the overall controller 310 executes a process for forming the seed layer. First, the substrate W is loaded into the processing chamber 1 of the seed layer forming apparatus 100A illustrated in FIG. 6. Specifically, the gate valve 12 is opened in the state in which the stage 2 is lowered to the transport position. Subsequently, the substrate W is loaded into the processing chamber 1 through the loading/unloading port 11 by a transport arm (not illustrated), and is placed on the stage 2 heated to a predetermined temperature (e.g., 150 degrees C. to 500 degrees C.) by the heater 21. Subsequently, the stage 2 is raised to the processing position, and the inside of the processing chamber 1 is decompressed to a predetermined degree of vacuum. Then, the processing gas supply 5 supplies $N_2$ gas into the processing chamber 1 to increase the pressure in the processing chamber 1 and to stabilize the temperature of the substrate W on the stage 2.

Subsequently, the processing gas supply 5B of the seed layer forming apparatus 100A supplies an organic source gas as the source gas from the source gas supply line L21 to the processing space 37. The organic source gas is a gas of an organic metal gas containing Ti, and an organic precursor, such as tetrakis(dimethylamino)titanium (TDMAT), may be used. The organic source gas has a higher adsorptivity than the source gas ($TiCl_4$ gas) of the film forming apparatus 200 with respect to the surface of the substrate W on which the seed layer 410 is not formed (the surface of the insulating film 402). Here, Ti originated from the organic source gas is denoted by reference numeral 411. As illustrated in FIG. 7B, the organic source gas is appropriately adsorbed on the surface of the substrate W.

Next, the processing gas supply 5B of the seed layer forming apparatus 100A supplies $N_2$ gas to the processing space 37 from the first flash purge line L25 and the second flash purge line L26 so as to purge the surplus source gas in the processing space 37.

Subsequently, the processing gas supply 5B of the seed layer forming apparatus 100A supplies a reducing gas from the reducing gas supply line L22. For example, $NH_3$ may be used as the reducing gas. Here, N originated from $NH_3$ is denoted by reference numeral 412. As illustrated in FIG. 7C, Ti 411 adsorbed on the seed layer 410 is nitrided. Thereby, the seed layer 413 is formed on the surface of the substrate W. That is, a discontinuous film of TiN is formed as the seed layer 413.

Next, the processing gas supply 5B of the seed layer forming apparatus 100A supplies $N_2$ gas to the processing space 37 from the first flash purge line L25 and the second flash purge line L26 so as to purge the surplus reducing gas in the processing space 37.

In addition, although the configuration in which a source gas and a reducing gas are supplied intermittently and alternately has been described as an example, the source gas and the reducing gas may be supplied continuously. When the source gas and the reducing gas are supplied intermittently, the supply may be performed, for example, between 1 and 100 cycles. In addition, the first continuous $N_2$ gas supply line L23, the second continuous $N_2$ gas supply line L24, the first flash purge line L25, and the second flash purge line L26 are not essential, and may be omitted.

Here, an example of process conditions of the process for forming the seed layer in the seed layer forming apparatus 100A is represented below.

Source gas: tetrakis(dimethylamino)titanium (TDMAT)
Reducing gas: $NH_3$
Substrate temperature: 150 to 500 degrees C.
Source gas flow rate: 30 to 200 sccm
Reducing gas flow rate: 5 to 40 L/min
Processing space pressure: 1 to 10 Torr In step S103, the overall controller 310 executes a process for forming the metal-containing film. Here, as in the present embodiment, a TiN film is formed on the substrate W through the ALD process.

Here, in the step of supplying $TiCl_4$ gas, a discontinuous film of TiN is formed as the seed layer 413 on the surface of the substrate W, and $TiCl_4$ is appropriately adsorbed on the seed layer 413 as illustrated in FIG. 7D. In addition, in the step of supplying $NH_3$ gas, as illustrated in FIG. 7E, Ti 421 adsorbed on the seed layer 413 is nitrided. Then, by repeating the steps in the ALD process in a predetermined number of cycles, the metal-containing film 420 having a desired film thickness is formed on the substrate W, as illustrated in FIG. 7F.

Figure 8:
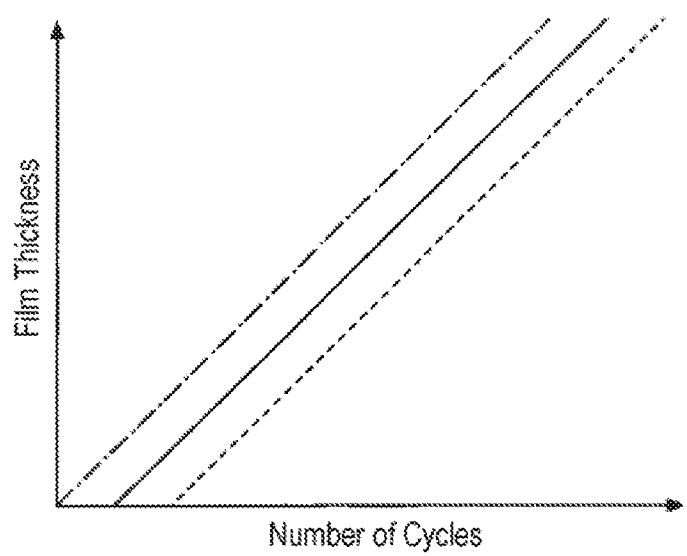
FIG. 8 is a graph representing a relationship between the number cycles in an ALD process and the thickness of a TiN film in a process for forming a metal-containing film.

FIG. 8 is a graph representing a relationship between the number of cycles in the ALD process and the thickness of a TiN film in the process for forming the metal-containing film. Here, the relationship between the number of cycles and the film thickness in the present embodiment is indicated by the solid line. In addition, the relationship between the number of cycles and the film thickness when a TiN film is formed through the ALD process without forming the seed layer is indicated by the broken line.

As represented in FIG. 8, according to the present embodiment (the first or second embodiment), it is possible to suppress an incubation time compared with the case where the seed layer is not formed. In addition, by appropriately changing the process conditions when forming the seed layer, the incubation time may approach zero (indicated by the one-dot chain line in FIG. 8). In other words, by appropriately changing the process conditions when forming the seed layer, it is possible to control the incubation time when forming the metal-containing film.

According to the present embodiment (the first or second embodiment), the film quality of the metal-containing film is improved by suppressing the incubation time when forming the metal-containing film. In other words, the surface uniformity of the metal-containing film is improved, and it is possible to improve the continuity of the metal-containing film even if the metal-containing film is thinned. In addition, it is possible to suppress the roughness of the metal-containing film.

As described above, the film forming method of the present embodiment using the cluster system 300 has been described. However, the present disclosure is not limited to, for example, the above-described embodiments, and within scope of the present disclosure described in the claims, various modifications and improvements are possible.

Figure 9:
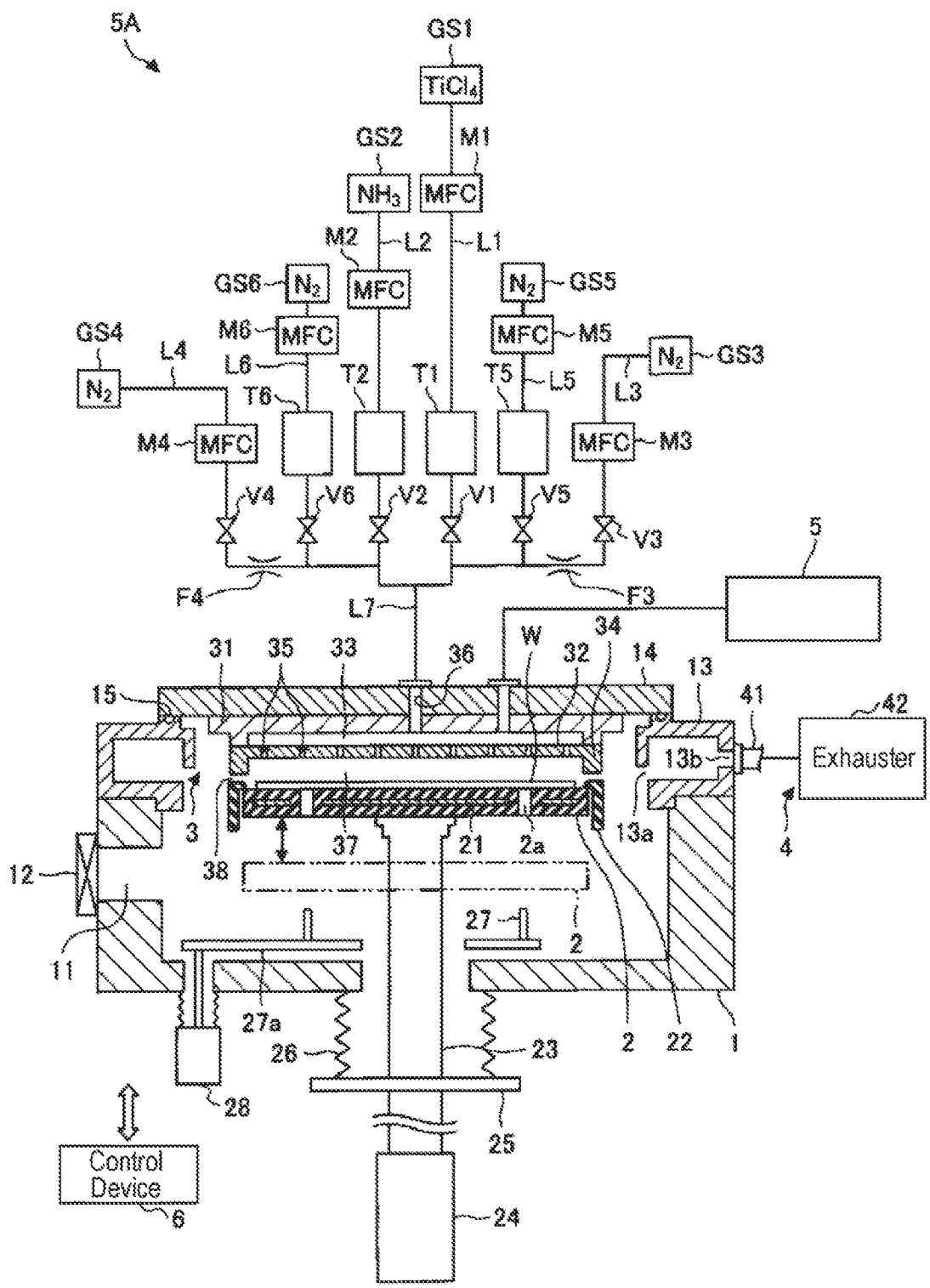
FIG. 9 is an example of a schematic cross-sectional view of a substrate processing apparatus according to a modification.

Although the substrate processing apparatus of the present embodiment has been described as separately including the processing chamber of the seed layer forming apparatus 100 and the processing chamber of the film forming apparatus 200, the present disclosure is not limited thereto. FIG. 9 is an example of a schematic cross-sectional view of a substrate processing apparatus 500 according to a modification. As illustrated in FIG. 9, a configuration in which the process for forming the seed layer in one processing chamber and the process for forming the metal-containing film may be performed may be used. Although FIG. 9 illustrates a configuration including the processing gas supply 5 and a processing gas supply 5A is illustrated as an example, a configuration including the processing gas supply 5B and the processing gas supply 5A may be used.

Although it has been described that the seed layer forming apparatus 100 and the film forming apparatus 200 are connected via the vacuum transport chamber 301 and a substrate W having thereon the seed film formed by the seed layer forming apparatus 100 is capable of being transported to the film forming apparatus 200 without being exposed to the atmosphere, the present disclosure is not limited thereto. When the substrate W is transported from the seed layer forming apparatus 100 to the film forming apparatus 200, it may be exposed to the atmosphere. However, it is desirable that the exposure time to the atmosphere be short.

In addition, the case in which the seed layer and the metal-containing film are formed on the insulating film 402 of the substrate W has been described as an example, but the present disclosure is not limited thereto, and is also applicable to the case in which the seed layer and the metal-containing film are formed on silicon (the silicon substrate 401).

Moreover, although the case where the metal-containing film is a TiN film has been described as an example, it is not limited thereto. The metal-containing film may be an AlN film. In this case, the organic source gas may be an organic metal gas containing Al, and an organic precursor such as trimethyl aluminum (TMA) may be used.

According to an aspect, it is possible to provide a substrate processing method and a substrate processing apparatus which improve the continuity of the metal-containing film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:
   providing a substrate;
   forming a seed layer on a surface of the substrate by heating a stage on which the substrate is placed to a first temperature and supplying a first source gas to the substrate; and
   forming a metal-containing film by heating the stage on which the substrate is placed to a second temperature and supplying a second source gas and a first reducing gas to the substrate on which the seed layer is formed,
   wherein the seed layer is a discontinuous film.

2. The substrate processing method of claim 1, wherein the seed layer has a higher adsorptivity of the second source gas than the surface of the substrate on which the seed layer is not formed.

3. The substrate processing method of claim 2, wherein the first source gas is a silicon-containing gas.

4. The substrate processing method of claim 3, wherein the first source gas is continuously supplied during the forming the seed layer.

5. The substrate processing method of claim 4, wherein the first reducing gas is a nitrogen-containing gas.

6. The substrate processing method of claim 5, wherein the second source gas is different from the first source gas.

7. The substrate processing method of claim 6, wherein the second source gas is a Ti-containing gas.

8. The substrate processing method of claim 1, wherein the first source gas is continuously supplied during the forming the seed layer.

9. The substrate processing method of claim 1, wherein, in the forming the seed layer, the seed layer is formed on the surface of the substrate by supplying the first source gas and a second reducing gas.

10. The substrate processing method of claim 9, wherein the first source gas and the second reducing gas are alternately supplied.

11. The substrate processing method of claim 9, wherein the first source gas has a higher adsorptivity on the surface of the substrate on which the seed layer is not formed than the second source gas.

12. The substrate processing method of claim 9, wherein the first source gas is an organic metal gas.

13. The substrate processing method of claim 12, wherein the organic metal gas is an Al-containing gas or a Ti-containing gas.

14. The substrate processing method of claim 1, wherein the first reducing gas is a nitrogen-containing gas.

15. The substrate processing method of claim 9, wherein each of the first reducing gas and the second reducing gas is a nitrogen-containing gas.

16. The substrate processing method of claim 1, wherein the second source gas is different from the first source gas.

17. The substrate processing method of claim 1, wherein the second source gas is a Ti-containing gas.

18. A substrate processing apparatus comprising:
   a processing chamber;
   a stage on which a substrate is placed;
   a gas supply configured to supply a gas to the processing chamber;
   a heater configured to heat the stage; and
   a controller configured to output a control signal so as to execute:
      providing the substrate on the stage;
      forming a seed layer on a surface of the substrate by heating the stage on which the substrate is placed to a first temperature using the heater and supplying a first source gas to the substrate through the gas supply; and
      forming a metal-containing film by heating the stage on which the substrate is placed to a second temperature using the heater and supplying a second source gas and a first reducing gas to the substrate on which the seed layer is formed through the gas supply,
   wherein the seed layer is a discontinuous film.

19. A substrate processing apparatus comprising:
a plurality of processing chambers, and a vacuum transport chamber,
wherein each processing chamber of the plurality of processing chambers further comprises:
a stage on which a substrate is placed;
a gas supply configured to supply a gas to the processing chamber; and
a heater configured to heat the stage, and
the substrate processing apparatus further comprises a controller configured to output a control signal so as to execute:
- providing the substrate on the stage in one processing chamber of the plurality of processing chambers;
- forming a seed layer on a surface of the substrate by heating the stage on which the substrate is placed to a first temperature using the heater and supplying a first source gas to the substrate through the gas supply;
- transporting the substrate from the one processing chamber to another processing chamber of the plurality of processing chambers through the vacuum transport chamber without exposing the substrate to atmosphere; and
- forming a metal-containing film by heating the stage on which the substrate is placed to a second temperature using the heater and supplying a second source gas and a first reducing gas to the substrate on which the seed layer is formed through the gas supply, wherein the seed layer is a discontinuous film.

* * * * *